US006867957B1

(12) United States Patent
Tong et al.

(10) Patent No.: US 6,867,957 B1
(45) Date of Patent: Mar. 15, 2005

(54) STACKED-NMOS-TRIGGERED SCR DEVICE FOR ESD-PROTECTION

(75) Inventors: Paul C. F. Tong, San Jose, CA (US); Ming-Dou Ker, Hsinchu (TW); Ping Ping Xu, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 246 days.

(21) Appl. No.: 10/065,364

(22) Filed: Oct. 9, 2002

(51) Int. Cl.[7] ................................. H02H 9/00
(52) U.S. Cl. ................. 361/56; 361/58; 361/111; 361/113
(58) Field of Search .................. 361/56, 58, 111, 361/113, 117, 118, 127, 91.1, 78, 100, 18

(56) References Cited

U.S. PATENT DOCUMENTS

| 4,996,626 A | 2/1991 | Say ........................... 361/56 |
| 5,293,057 A | 3/1994 | Ho et al. ................... 257/356 |
| 5,311,391 A | 5/1994 | Dungan et al. ............. 361/56 |
| 5,550,699 A | 8/1996 | Diaz .......................... 361/56 |
| 5,565,790 A | 10/1996 | Lee ............................ 326/30 |
| 5,646,809 A | 7/1997 | Motley et al. .............. 361/56 |
| 5,905,614 A | 5/1999 | Colombo ................... 361/56 |
| 6,052,019 A | 4/2000 | Kwong ..................... 327/437 |
| 6,078,487 A | 6/2000 | Partovi et al. .............. 361/56 |
| 6,320,408 B1 | 11/2001 | Kwong ....................... 326/31 |

OTHER PUBLICATIONS

Miller, Khazhinsky & Weldon, "Engineering the Cascoded NMOS Output Buffer for Maximum Vt1", 2000 EOS–ESD Symposium Technical Digest, pp. 308–317.
Ker & Chuang, "Electrostatic Discharge Protection Design for Mixed–Voltage CMOS I/O Buffers", IEEE JSSC, vol. 37 No. 8 pp. 1046–1055, Aug., 2002.
Chatterjee & Polgreen, "A Low–Voltage Triggering SCR for On–Chip ESD Protection at Output and Input Pads" IEEE Elect Dev Ltes, vol. 12, No. 1, Jan. 1991, pp. 21–22.

*Primary Examiner*—Stephen W. Jackson
(74) *Attorney, Agent, or Firm*—Stuart T. Auvinen

(57) ABSTRACT

Transistors with very thin gate oxides are protected against oxide failure by cascading two or more transistors in series between an output pad and ground. The intermediate source/drain node between the two cascaded transistors is usually floating during an ESD test, delaying snapback turn-on of a parasitic lateral NPN transistor. This intermediate node is used to drive the gate of an upper trigger transistor. A lower trigger transistor has a gate node that is charged by the ESD pulse on the pad through a coupling capacitor. When the coupled ESD pulse turns on the trigger transistors, the trigger transistors turn on a silicon-controlled rectifier (SCR) that is integrated with the trigger transistors.

19 Claims, 6 Drawing Sheets

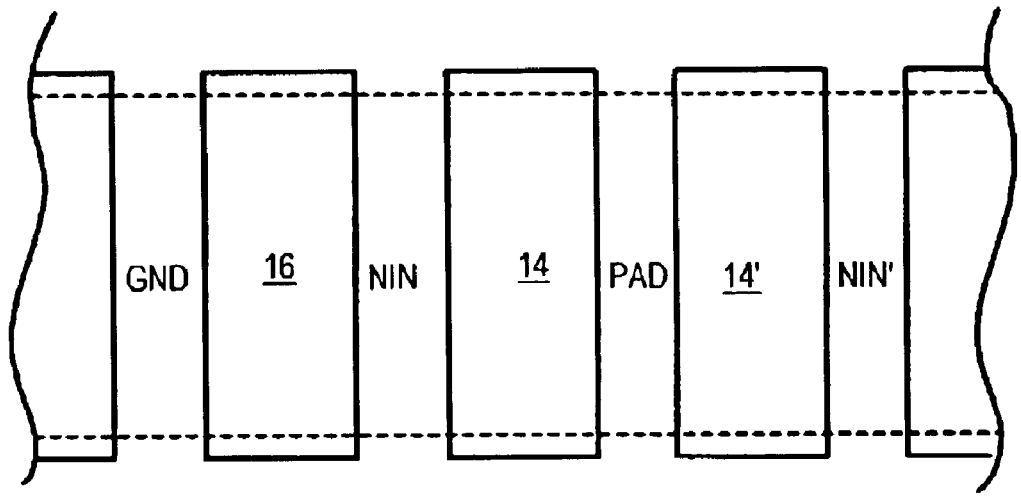
PRIOR ART     FIG. 2
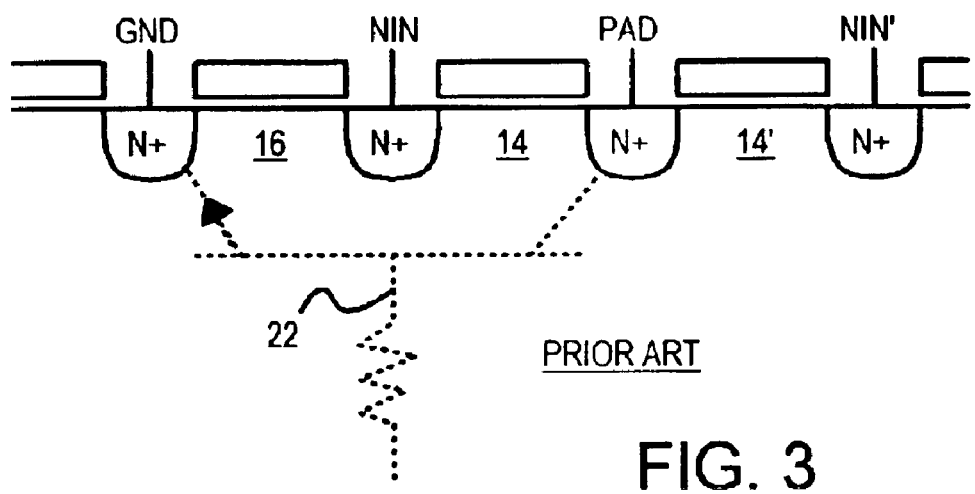
PRIOR ART
FIG. 3

US 6,867,957 B1

STACKED-NMOS-TRIGGERED SCR DEVICE FOR ESD-PROTECTION

BACKGROUND OF INVENTION

This invention relates to electro-static-discharge (ESD) protection circuits, and more particularly to cascaded-transistor input-protection devices.

Relatively small electric shocks can melt or otherwise destroy tiny structures in an integrated circuit (IC). To reduce such damage, input and output pads of IC chips are typically connected to protection devices specifically designed to shunt electro-static-discharges (ESD). These ESD-protection devices have been effective for semiconductor processes used in the last decade.

Processing improvements have continued to reduce the size of IC transistors and the thicknesses of films used to make the transistors. For example, the gate oxide between the silicon substrate and the polysilicon or other gate material has been reduced to as little as 32 angstroms for a process with a minimum gate length of 0.18 micron. These thin gate oxides present a challenge since they may be damaged by relatively small voltages.

For example, a gate oxide may have a breakdown of 4 volts, which is less that the traditional 5-volt power supply. Reduced power-supply voltages of 3 or 1.8 volts have helped prevent oxide breakdown. However, the IC chip with the thin gate oxide may be electrically connected to another chip that drives S-volt signals that could destroy the delicate gate oxides. Even reduced voltages such as 3.3 volts may damage gate oxides with breakdown voltages of 4 volts, since a 3.3-volt signal is so close to the breakdown limit. The long-term reliability of the gate oxide is also a concern.

Some dual-gate-oxide processes allow for a thin gate oxide to be used for core transistors, but a thicker gate oxide to be used for I/O transistors. While useful, the extra processing steps for the thicker I/O oxide add cost and are not desirable.

Semiconductor processes with low gate-breakdown voltages may require cascading transistors to reduce the voltage applied to any single transistor. Stacked or cascaded transistors are widely used for I/O circuits when only thin gate oxides are available. FIG. 1 shows an output buffer using cascaded transistors. Internal circuitry including a pre-driver generate signal VN to the gate of n-channel driver transistor 16. A bias voltage VBN is applied to the gate of n-channel limiting transistor 14.

The bias voltage VBN can be a constant voltage (such as Vcc) that causes limiting transistor 14 to remain on. The voltage stress seen by the gate oxide at the Drain/Gate overlap region of transistor 14 is reduced to Vpad Vcc, which is less than the gate oxide breakdown voltage.

When a high and potentially damaging voltage is applied to the pad, this voltage is reduced somewhat by the voltage drop across the channel of limiting transistor 14. Thus the voltage on node NIN is less that the maximum voltage applied to the pad, reducing the gate-to-drain voltage on driver transistor 16 to Vcc-Vtn.

Also, since the bias voltage VBN may be set to power (Vcc), the gate-to-drain voltage of limiting transistor 14 can be less than the maximum that could occur if its gate was driven fully to ground. Thus the voltage across the gate of limiting transistor 14 is less than the gate breakdown voltage.

FIG. 2 shows that n-channel cascaded transistors in an output buffer are often laid out parallel to one another.

Polysilicon gates are laid out vertically across an active region in the p-type substrate, with sources and drain between the poly gates in the active areas. Contacts to metal layers can be included in these source and drain regions but are not shown.

In this example, the source active region which is connected to ground is to the left of the poly gate of n-channel driver transistor 16, while the drain region is to the right of the poly gate of transistor 16. The active area for the drain of transistor 16 is shared with the source of limiting transistor 14, saving die area. This source/drain region is node NIN. This region may be made narrower that for the ground and pad connections since metal contacts may not be needed for this intermediate node.

N-channel limiting transistor 14 has its source on the left, node NIN, and its drain on the right, pad node PAD. Often several legs or fingers of polysilicon gates are required to meet the desired gate width of the overall transistor. Thus a second polysilicon gate transistor 14' for transistor 14 is to the right, sharing pad node PAD and having a source node NIN' to the right. Nodes NIN and NIN' may or may not be connected together by metal lines and contacts.

FIG. 3 shows a cross-section of the n-channel cascaded transistors laid out in FIG. 2. N+ source and drain regions are connected to ground, node NIN, the pad, and node NIN' from left to right, while poly gates are formed above channels in the substrate for transistors 16, 14, 14'.

Parasitic lateral NPN transistors are also formed by the MOS transistor structures. For example, the grounded source and drain at node NIN of transistor 16 form one NPN transistor, while the source at node NIN and drain at node PAD of transistor 14 form another NPN transistor. The bases of these transistors are the channels in the p-substrate under the poly gates.

A third lateral NPN transistor 22 is shown. This lateral NPN transistor is larger, spanning two transistors 16, 14. The emitter of NPN transistor 22 is the grounded source of driver transistor 16, while the collector of NPN transistor 22 is the drain of limiting transistor 14 which is connected to the pad. The base of NPN transistor 22 is the p-type substrate between the ground and pad N+ regions.

This NPN transistor 22 goes under the intermediate N+ region of node NIN, and current flows under this intermediate NPN region when NPN transistor 22 is turned on, such as during an ESD event.

The base width of this larger NPN transistor 22 is much larger than the base width of the smaller parasitic NPN transistors that correspond to transistors 16, 14. Thus NPN transistor 22 is less likely to conduct given identical bias conditions of emitter, base, and collector terminals of the parasitic NPN transistors.

However, when two n-channel transistors are cascaded, the bias conditions are not identical but are very different. The intermediate node NIN is not biased but is floating. The snapback characteristics of this n-channel stack structure has been theoretically explained in James Miller's paper "Engineering the Cascoded NMOS Output Buffer for Maximum Vt1" published in the 2000 EOS-ESD Symposium Technical Digest, pp.308–317. Empirical measurements have shown that the n-channel cascaded/stack configuration has a higher trigger voltage Vt1 and a higher snapback holding voltage Vsb, but a lower secondary breakdown current It2 as compared to a single n-channel transistor. This means a degraded ESD performance is expected in a stacked transistor structure.

Earlier output buffers that did not cascade transistors had just the smaller parasitic NPN transistor. This smaller NPN transistor was easier to turn on during an ESD event since it had a smaller base width. Thus the MOS driver transistors of earlier output buffers served as a good ESD protection device due to their parasitic NPN transistors.

The higher breakdown voltage of the larger NPN transistor 22 is undesirable since it allows a larger voltage to occur on the pad during an ESD event. The larger ESD voltage that occurs before the parasitic NPN transistor turns on can damage the transistors and gate oxides, causing permanent failures from ESD events.

Simply adding a standard ESD structure to the pad can cause reliability failures. A standard ESD structure with a single transistor to shunt current from the pad to ground or power could have gate-oxide failures due to the full voltage across the one shunt transistor. The width of the base of NPN transistor 22 could be reduced by removing any contacts to metal in the shared source/drain region (node NIN), but then this layout is no longer generic and useable for other logic gates that need the contacts.

A new ESD device based on a silicon-controlled rectifier (SCR) has been developed by one of the inventors. Ming-Dour Ker published the article "Electrostatic Discharge Protection Design for Mixed-Voltage CMOS I/O Buffers" in IEEE Journal of Solid State Circuits, vol.37 #8 pp.1046–1055, August,2002. The Stacked-NMOS Triggered SCR device (SNTSCR) is disclosed. The SNTSCR device requires synchronized triggering of the gates of the Stacked-NMOS transistors embedded in the new SCR device.

What is desired is a cascaded ESD-protection structure that can use the cascaded transistors of an output buffer. Cascaded transistors are desired to reduced voltages applied across thin gate oxides of the transistors. A modification to a cascaded output buffer is desired to reduce the breakdown or snap-back voltage. A more robust ESD structure with a lower breakdown voltage is desired to protect the delicate transistors and gate oxides of smaller devices. Use of the new stacked-NMOS-triggered SCR in a cascaded-transistor output is desired.

BRIEF DESCRIPTION OF DRAWINGS

FIG. 2 shows that cascaded n-channel transistors in an output buffer are often laid out parallel to one another.

FIG. 3 shows a cross-section of the n-channel cascaded transistors laid out in FIG. 2.

DETAILED DESCRIPTION

The present invention relates to an improvement in ESD protection circuits. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that the floating intermediate node between two transistors cascaded together increases the breakdown or snapback voltage of the parasitic NPN transistor. The parasitic NPN transistor is harder to turn on, providing less protection during an ESD event, possibly resulting in failures and damage.

The inventors have realized that the new stacked-NMOS-triggered SCR (SNTSCR) can be combined with the cascaded transistors for ESD protection. The inventors take advantage of the well behaved voltage (VBN-Vtn) of the intermediate node NIN of the cascaded transistors to directly drive the triggering gate of the SNTSCR device.

By suitable design of a coupling capacitor and resistor values, the SNTSCR device: can be kept off under normal operating conditions. During the positive-to-VSS ESD event, a high ESD voltage is applied to the I/O pad with VSS grounded but VDD (Vcc) floating. In this ESD stress configuration, a capacitor couples the ESD transient voltage from the I/O pad to a transistor gate that triggers the SNTSCR device on, effectively shunting the ESD current from I/O pad to the ground or VSS bus.

Figure 1:
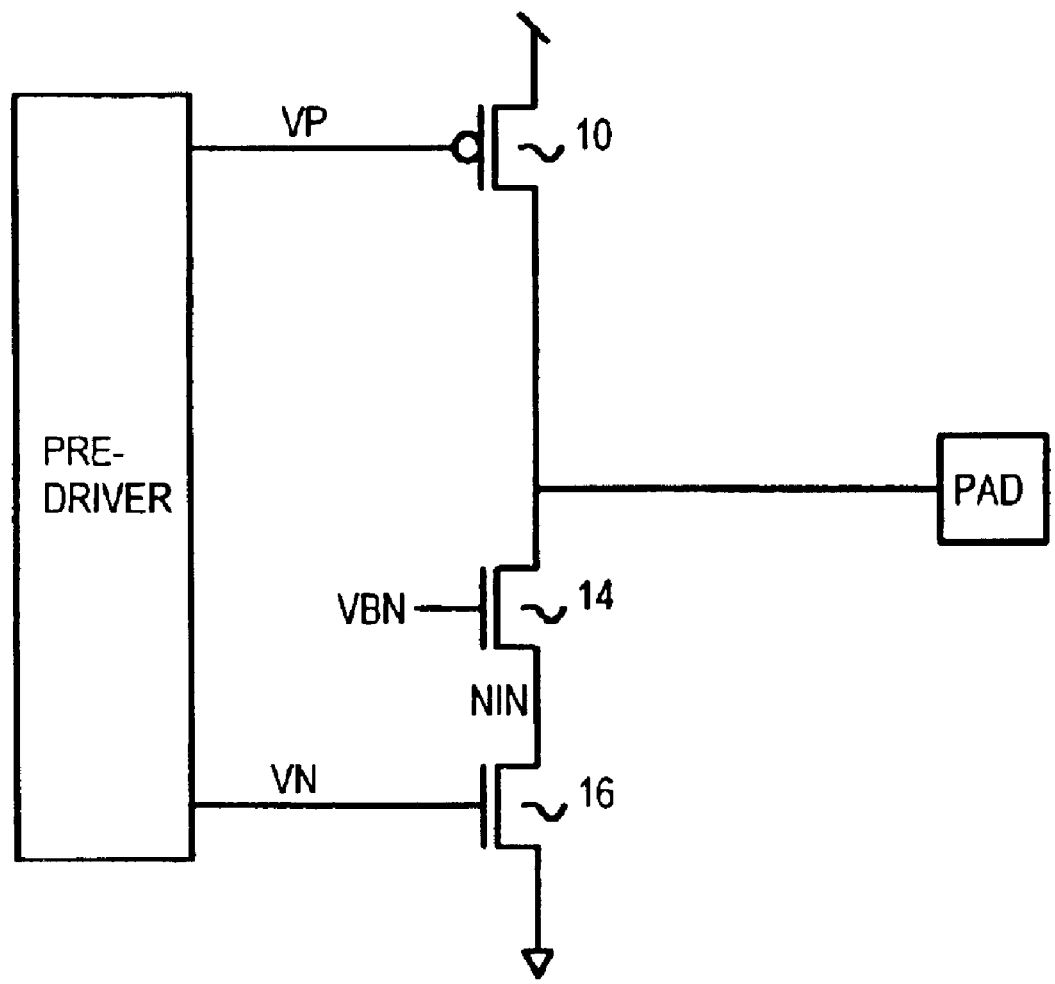
FIG. 1 shows an output buffer using cascaded transistors.
Figure 4:
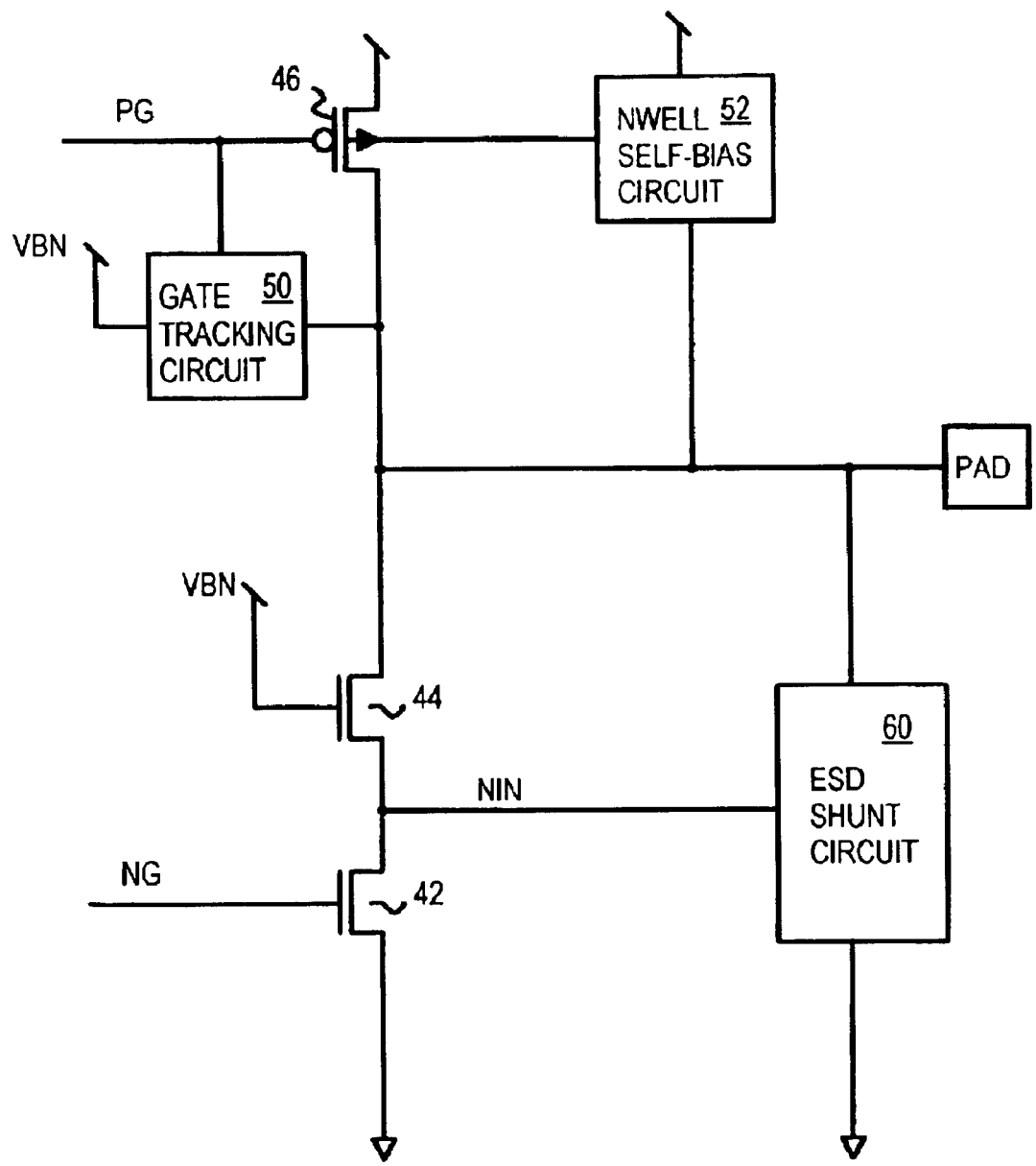
FIG. 4 illustrates a cascaded-transistor output buffer that has an intermediate node connected to an ESD protection device.

FIG. 4 illustrates a cascaded-transistor output buffer that has an intermediate node connected to an ESD protection device. Core circuitry including a pre-driver generates signals PG, NG which carry data to be output to the pad. PG and NG are usually in the same state to output data, but the output buffer can be disabled by driving PG high and NG low.

Signal PG is applied to the gate of p-channel driver transistor 46, while signal NG is applied to the gate of n-channel driver transistor 42. Usually only one of driver transistors 42, 46 is on at any one time.

Bias voltages may also be generated Bias VBN is applied to the gate of n-channel channel limiting transistor 44. The bias voltage VBN is usually set to be the same potential as the power rail, VDD (such as 1.8V) so that when a high voltage (3.3V) is applied to the I/O pad, the potential across the gate oxide in the Drain/Gate overlap region of n-channel transistor 44 is still well within the safe operating voltage region of the gate oxide. Since the voltage at the intermediate node NIN is VDD Vtn, this voltage drop across limiting transistor 44 protects driver from damage.

When power is disconnected, such as during an ESD test, intermediate node NIN, is typically floating. When an ESD pulse is applied between the pad and ground, the drain junction of n-channel transistor 44 goes into avalanche breakdown, and hole current starts to flow in the local p-substrate. This triggers the parasitic NPN of n-channel transistor 44, resulting in passing a high voltage to node NIN. This high voltage from limiting transistor 44 turns on or triggers ESD shunt device 60, effectively shunting the ESD current from I/O pad to the VSS bus. This prevents damage during the ESD event. ESD shunt device 60 can be a SNTSCR that is triggered by the ESD pulse on the pad, and closes to dynamically ground the I/O Pad. The ESD current is thus shunted harmlessly to ground.

Gate tracking circuit 50 operates to connect gate node PG of p-channel driver transistor 46 to the I/O Pad voltage when the 110 Pad voltage is higher than Vcc. This keeps p-channel driver transistor 46 off. However when the I/O Pad voltage is lower than Vcc, gate tracking circuit 50 allows gate node PC of p-channel driver transistor 46 to be directly driven by the pre-driver circuit.

N-Well self-biasing circuit 52 also acts to place the highest available voltage on the well beneath p-channel driver transistor 46. Normally power Vcc is higher than the I/O pad voltage, so N-Well self-biasing circuit 52 couples Vcc to the N-well, keeping p-channel driver transistor 46 turned off. However, when power is off and the I/O pad is high, N-Well self-biasing circuit 52 couples the I/O pad voltage to the N-well to keep p-channel driver transistor 46 off. Such gate tracking and N-Well self-biasing circuits have been described by Kwong in "Undershoot-Isolating MOS Bus Switch" U.S. Pat. No. 6,052,019 and "Dual-Sided Undershoot-Isolating Bus Switch", U.S. Pat. No. 6,320,408.

Figure 5:
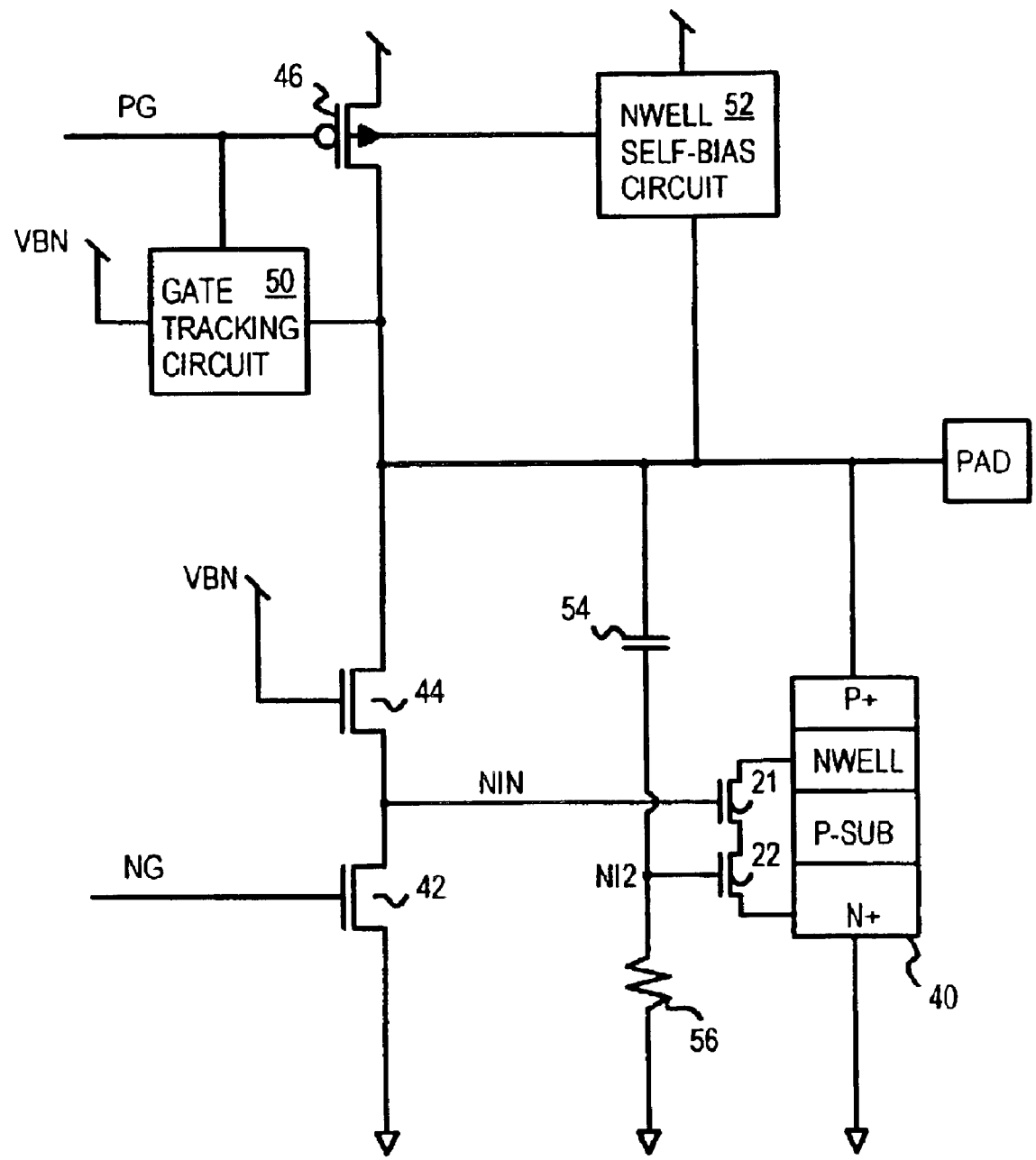
FIG. 5 is an ESD protection circuit with cascaded gates coupled to trigger a stacked NMOS triggered SCR device.
Figure 6:
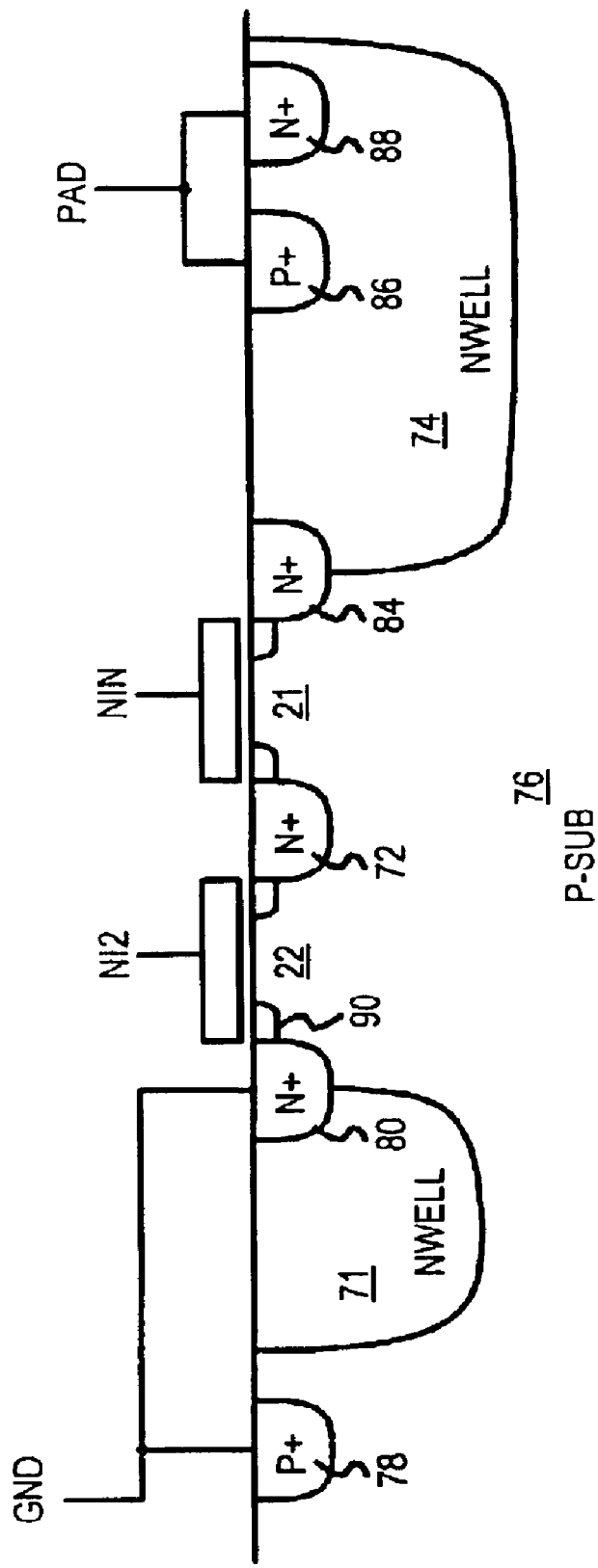
FIG. 6 is a cross-sectional diagram of the stacked-NMOS-triggered SCR.

FIG. 5 is an ESD protection circuit with cascaded gates coupled to trigger a stacked NMOS triggered SCR device. SNTSCR 40 is a PNPN SCR device formed by a lateral stack of a p+ region, N-well, p-type-substrate, and N+ region. In addition to the normal PNPN structure in the silicon substrate, two n-channel MOS transistors are formed over the PNPN structure to form a SNTSCR device. Trigger transistors 21, 22 are an integral part of SNTSCR 40 and act to trigger the rectifier action. FIG. 6 shows a cross section of SNTSCR 40.

The gate of n-channel trigger transistor 21 is driven by the intermediate node NIN between cascaded transistors 42, 44. The gate of n-channel trigger transistor 22 is driven by coupled node NI2, which is between capacitor 54 and resistor 56. During an ESD event on the I/O pad, part of the rapid voltage rise is coupled across capacitor 54 to node NI2, turning on trigger transistor 22. After some time, resistor 56 discharges, capacitor 54. During normal operation smaller voltage rises are coupled to node NI2. These smaller voltage rises are Insufficient to turn on trigger transistor 22 during normal operation.

When an ESD event occurs on the I/O pad, limiting transistor 44 snaps back and conducts a high voltage to intermediate node NIN. This high voltage on intermediate node NIN turns on trigger transistor 21. Coupling capacitor 54 is designed to couple some of the transient ESD voltage from the I/O pad to raise coupled node NI2 to a voltage above the threshold voltage to turn-on n-channel trigger transistor 22. Since both trigger transistors 21, 22 are turned on, SNTSCR 40 is triggered on, effectively shunting the ESD current from I/O pad to the VSS bus.

During normal operation, the intermediate node NIN is held at Vcc-Vtn, so n-channel trigger transistor 21 remains turn on. However, coupled node NI2 is below the threshold voltage of n-channel trigger transistor 22 during normal operating conditions, so that n-channel trigger transistor 22 remains in the cut off mode. Since there is an electrical discontinuity between transistor 21 and 22, as trigger transistor 22 is off, SNTSCR 40 also remains in the shut off mode.

Gate tracking circuit 50 acts to apply the I/O pad to gate node PG to keep p-channel driver transistor 46 from leaking when the I/O Pad voltage is higher than Vcc. Likewise, N-Well self-biasing circuit 52 acts to apply the higher of Vcc or the I/O pad to the N-well to further prevent leakage of p-channel driver transistor 46.

FIG. 6 is a cross-sectional diagram of the stacked-NMOS-triggered SCR. The basic P—N—P—N SCR structure is formed in the substrate by p+ region 86. N-well 74, p-substrate 76, and N+ region 80. N-well 74 is biased to the I/O pad voltage by N+ tap 88, while p-substrate 76 is biased to ground by P+ tap 78. Second N-well 71 is to enhance the emitter efficiency of lateral NPN transistors in the lateral SCR device. This Nwell cathode can provide more effective conducting paths to bypass ESD current.

The I/O pad is connected to P+ region 86 and N-well 74 through N+ tap 88. Ground is connected to p-substrate 76 through P+ tap 78 and to N+ region 80. Thus two of the four P·N—P—N regions are connected to power and two are connected to the I/O pad.

Trigger transistors 21, 22 are formed by polysilicon or other gates above p-substrate 76. Source or drain regions are formed by N+ regions 80, 72, 84. Lightly-doped N− drains 90 may be used in some processes.

N+ region 80 connected to ground acts as a source while N+ region 84 connected to the I/O pad acts as a drain during a positive ESD event. Intermediate N+ region 72 between transistors 21, 22 is floating and not directly connected to other circuit nodes.

During an ESD event, high voltages are applied to the gates of trigger transistors 21, 22. Conducting channels are formed under the transistor gates. These conducting channels allow current to flow from the I/O pad at N+ region 84 to grounded N+ region 80 by triggering on the SNTSCR device via the snapback of trigger transistor 21.

Figure 7:
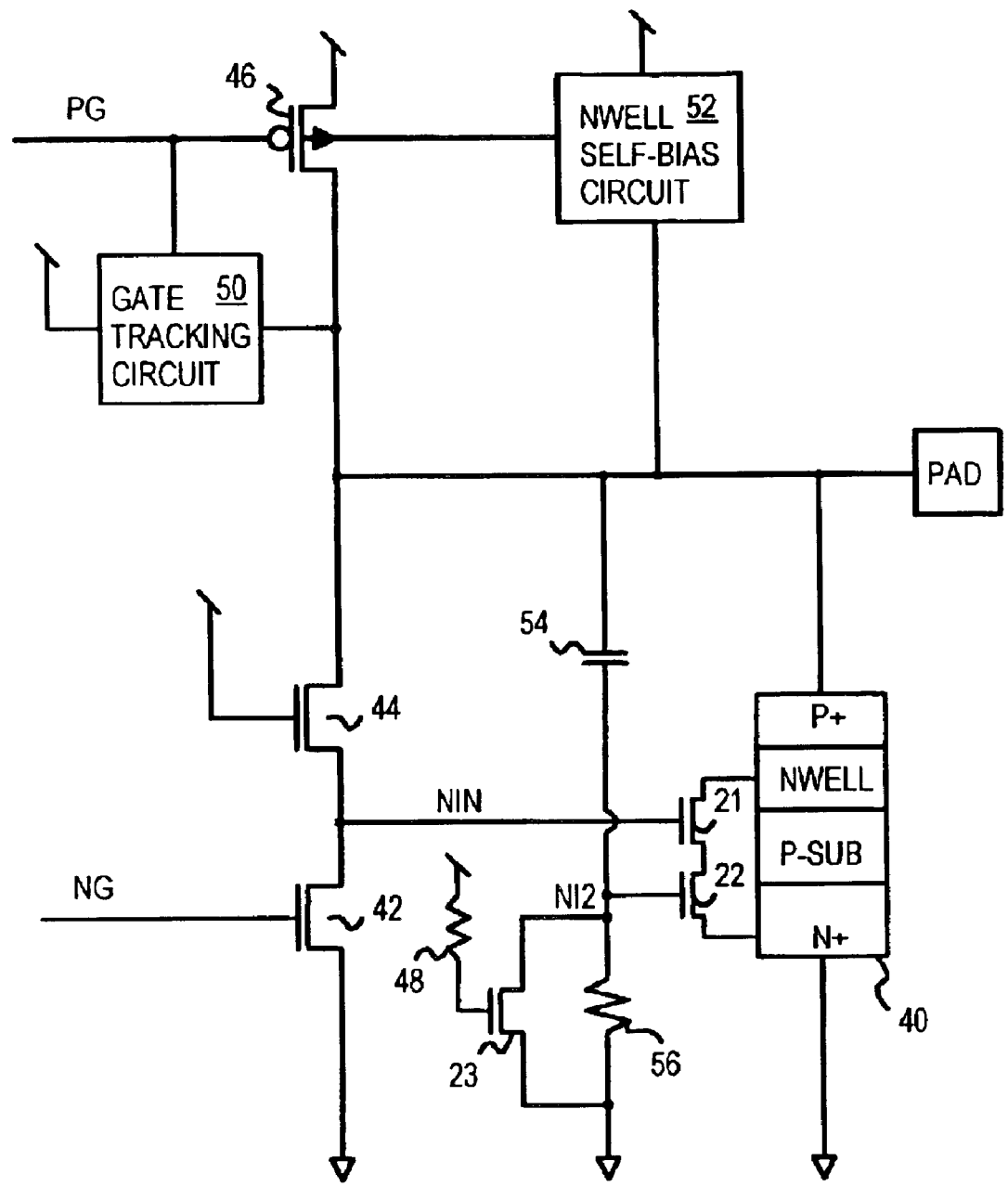
FIG. 7 is an alternative triggering circuit.

FIG. 7 is an alternative triggering circuit. To improve the design window for values of coupling capacitor 54 and leaker resistor 56 in the triggering circuit, n-channel clamping transistor 23 is added. N-channel clamping transistor 23 is added across the 56, between the gate of trigger transistor 22 and ground. The gate of clamping transistor 23 is biased at Vcc through diffusion resistor 48. Under normal circuit operation, n-channel clamping transistor 23 is always turned on to clamp the coupling node NI2 to below the threshold voltage of trigger transistor 22 to keep transistor 22 always off. Therefore SNTSCR 40 can be guaranteed to remain off under normal circuit operating conditions.

Under the ESD stress condition, n-channel clamping transistor 23 is off since the initial voltage level on the floating Vcc bus is zero. The voltage NI2 coupled to the gate of trigger transistor 22 is determined by the resistor 56 and the coupling capacitor 54. Therefore, the optimum design window for the sustaining resistance and coupling capacitance of this modified ESD detection circuit can be improved since clamping transistor 23 ensures that trigger transistor 22 remains off during normal powered operation.

Alternate Embodiments

Several other embodiments are contemplated by the inventors. For example more than two transistors can be cascaded in series to provide more voltage protection, and the SNTSCR may have more than two triggering transistors. Several other embodiments are contemplated by the inventors. For example the MOS transistors could be replaced with bipolar transistors. The bases of the bipolar transistors replace the gates, since the bases control current flow between the collector and emitter. Diodes, resistors, capacitors, and other transistors could be added to the circuits. Additional protection devices could be added.

The invention could be applied to many types of IC chips. The invention could also protect ordinary inputs, outputs, and I/O's. Other kinds of transistors could also be used. Sizing of transistors and capacitors can be estimated and verified or adjusted based on simulation results. Each I/O pin could be an input, output, or a bi-directional pin. For an ESD test between pins A and B, a negative ESD pulse on pin A when pin B is grounded can be considered equivalent to a positive ESD pulse applied to pin B when pin A is grounded.

Many protection circuits can be integrated together on a single substrate of a single chip. Other functions and circuits can be included on the chip. The pin can be a bonding pad on a semiconductor chip that is for connecting to a bonding wire or ball that electrically connects to a pin or connector of a package. The terms source and drain can change, depending on applied voltage biases. Current can be positive current or negative current flowing in an opposite direction.

The resistor could be replaced by other leaker devices, such as transistors. The coupling capacitors can be implemented as p-channel or n-channel transistors each with the source and drain connected together as one terminal of the capacitor, and the transistor gate as the second capacitor terminal.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. § 1.72(b). Any advantages and benefits described may not apply to all embodiments of the invention. When the word "means" is recited in a claim element, Applicant intends for the claim element to fall under 35 USC § 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC § 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A cascaded-transistor electro-static-discharge (ESD) protected output buffer comprising:
   a pull-down cascade between a pad and a ground bus having in series at least a first n-channel transistor and a second n-channel transistor that share an intermediate source/drain node, the pull-down cascade for sinking current from the pad to the ground bus through a first channel between a source and a drain of the first n-channel transistor and through a second channel between a source and a drain of the second n-channel transistor;
   a coupling capacitor between the pad and a coupled node; and
   an ESD switch, activated by an ESD pulse applied to the pad and responsive to the intermediate source/drain node, for shunting the pad to the ground bus in response to the ESD pulse coupled to the intermediate source/drain node;
   wherein the ESD switch comprises;
   a second trigger gate in series with the first trigger gate, the second trigger gate being coupled to the pad by a coupling capacitor;
   whereby the intermediate source/drain node triggers the ESD switch to shunt the pad to the ground bus during the ESD pulse.

2. The cascaded-transistor ESD protected output buffer of claim 1 wherein the ESD switch comprises a silicon-controlled rectifier (SCR) having a first trigger gate coupled to the intermediate source/drain node;
whereby the intermediate source/drain node is connected to the first trigger gate to trigger the SCR during the ESD pulse.

3. The cascaded-transistor ESD protected output buffer of claim 2 wherein the SCR is responsive to the coupled node and to the intermediate source/drain node, the SCR connecting the pad to the ground bus when a portion of the ESD pulse applied to the pad is coupled across the coupling capacitor to the coupled node and a portion of the ESD pulse applied to the pad is coupled through the second n-channel transistor to the intermediate source/drain node.

4. The cascaded-transistor ESD protected output buffer of claim 3 wherein the SCR, the first trigger gate and the second trigger gate comprise a stacked-NMOS-triggered SCR.

5. The cascaded-transistor ESD protected output buffer of claim 4 wherein the first trigger gate and the second trigger gate comprise n-channel transistors formed over the SCR formed on a substrate.

6. The cascaded-transistor ESD protected output buffer of claim 5 wherein the first trigger gate forms a transistor between a first N+ region and an intermediate N+ source/drain in a p-type substrate;
wherein the second trigger gate forms a transistor between a the intermediate N+ source/drain in the p-type substrate and a second N+ region.

7. The cascaded-transistor ESD protected output buffer of claim 6 wherein the first N+ region is indirectly connected to the pad by an N-well that has a N+ tap and a P+ region directly connected to the pad;
wherein the second N+ region is directly connected to the ground bus and the p-type substrate is indirectly connected to the ground bus through a P+tap that is directly connected to the ground bus.

8. The cascaded-transistor ESD protected output buffer of claim 2 further comprising:
   a first resistor between the coupled node and the ground bus.

9. The cascaded-transistor ESD protected output buffer of claim 8 further comprising:
   a clamping transistor for connecting the coupled node to the ground bus when the cascaded-transistor ESD protected output buffer is powered.

10. The cascaded-transistor ESD protected output buffer of claim 2 wherein the first n-channel transistor has a gate driven by a data signal that switches between power and ground during normal operation;
   wherein the second n-channel transistor has a gate driven by a bias voltage between power and ground, the second n-channel transistor limiting current through the first n-channel transistor.

11. The cascaded-transistor ESD protected output buffer of claim 10 further comprising:
   a first p-channel transistor for driving the pad high, the first channel transistor having a gate driven by a data signal that switches between power and ground during normal operation.

12. The cascaded-transistor ESD protected output buffer of claim 11 further comprising:
   a gate-tracking circuit for applying a highest voltage to a gate of the first channel transistor, the highest voltage being a higher of a power-supply voltage or a pad voltage on the pad.

13. A cascaded protection device comprising:
a first transistor having a gate driven by a first signal, a drain connected to a pad node, and a source connected to a first intermediate node;
a second transistor having a gate driven by a second signal, an drain connected to the first intermediate node, and a source connected to a supply bus;
a coupling capacitor between the pad node and a first gate node;
a silicon-controlled rectifier (SCR) coupled between the pad node and the supply bus;
a first trigger transistor having a gate connected to the first intermediate node;
a second trigger transistor having a gate connected to the first gate node;
wherein the first trigger transistor and the second trigger transistor form conducting channels in the SCR to activate the SCR to conduct;
a resistor connected between the first gate node and the supply bus, whereby a potentially-damaging voltage change on the pad node is coupled across the coupling capacitor to turn on the second trigger transistor which activates the SCR to conduct current from the pad node to the supply bus.

14. The cascaded protection device of claim 13 wherein the supply bus is ground, and the first and second transistors are n-channel transistors.

15. The cascaded protection device of claim 14 herein the first signal is a data signal that switches between a ground and a power supply voltage to signal data changes to be transmitted out the pad node;
wherein the second signal is a constant bias voltage between the ground and the power supply voltage or is the power supply voltage.

16. The cascaded protection device of claim 14 wherein the second signal is: a data signal that switches between a ground and a power supply voltage to signal, data changes to be transmitted out the pad node;
wherein the fist signal is a constant bias voltage between the ground and the power supply voltage or is the power supply voltage.

17. A shock-protection circuit comprising:
external connect means for connecting to an external input or output of an integrated circuit chip;
transistor cascade means, having at least two transistors in series with and an intermediate node in between, for conducting current from the external connect means to a supply bus;
rectifier means, for conducting current from the external connect means to the supply bus in response to a gate node and the intermediate node;
coupling means, between the external connect means and the gate node, for coupling a portion of a voltage shock applied to the external connect means to the gate node, wherein the portion is at least a threshold voltage; and
leaker means, coupled between the gate node and the supply bus, for discharging the gate node after the voltage shock is applied, and for connecting the gate node to the supply bus when no voltage shock is applied;
wherein the rectifier means is triggered to conduct by both the gate node and the intermediate node;
whereby the rectifier means is triggered by the intermediate node and the gate node during the voltage shock to shunt the voltage shock.

18. The shock-protection circuit of claim 17 wherein the supply bus is a ground bus, and the transistor cascade means comprises at least two n-channel transistors.

19. The shock-protection circuit of claim 17 wherein the rectifier means comprises a stacked-NMOS-triggered silicon-controlled rectifier having a first trigger gate coupled to the gate node and a second trigger gate coupled to the intermediate node.

\* \* \* \* \*